US009627107B2

(12) United States Patent
Usoskin

(10) Patent No.: US 9,627,107 B2
(45) Date of Patent: Apr. 18, 2017

(54) METHOD FOR OPERATING A SUPERCONDUCTIVE DEVICE WITHOUT AN EXTERNAL SHUNT SYSTEM, IN PARTICULAR WITH A RING SHAPE

(71) Applicant: Bruker HTS GmbH, Hanau (DE)

(72) Inventor: Alexander Usoskin, Hanau (DE)

(73) Assignee: Bruker HTS GmbH, Hanau (DE)

( * ) Notice: Subject to any disclaimer, the term of this patent is extended or adjusted under 35 U.S.C. 154(b) by 0 days.

(21) Appl. No.: 14/658,323

(22) Filed: Mar. 16, 2015

(65) Prior Publication Data

US 2015/0187466 A1 Jul. 2, 2015

Related U.S. Application Data

(63) Continuation of application No. 13/904,080, filed on May 29, 2013, now abandoned.

(30) Foreign Application Priority Data

Jun. 6, 2012 (EP) .................................. 12 171 087

(51) Int. Cl.

| | |
|---|---|
| ***H01B 12/00*** | (2006.01) |
| ***H01B 12/06*** | (2006.01) |
| ***H01L 39/16*** | (2006.01) |
| ***H02H 9/02*** | (2006.01) |

(52) U.S. Cl.

CPC ............. *H01B 12/06* (2013.01); *H01L 39/16* (2013.01); *H02H 9/023* (2013.01)

(58) Field of Classification Search

CPC ......... H01B 12/06; H02H 9/023; H01L 39/16

USPC ................................ 505/211, 212, 925, 926

See application file for complete search history.

(56) References Cited

U.S. PATENT DOCUMENTS

| | | | | |
|---|---|---|---|---|
| 2003/0130129 | A1* | 7/2003 | Seleznev et al. | 505/230 |
| 2007/0173410 | A1* | 7/2007 | Usoskin et al. | 505/211 |
| 2009/0156409 | A1* | 6/2009 | Hazelton et al. | 505/230 |
| 2010/0210468 | A1* | 8/2010 | Lee et al. | 505/410 |

(Continued)

FOREIGN PATENT DOCUMENTS

EP 2192629 * 6/2010 ............. H01L 39/16

OTHER PUBLICATIONS

Hotta et al. "Over-Current Carrying Characteristics of Rectangular-Shaped YBCO Thin Films Prepared by MOD Method." Journal of Physics: Conference Series 97 (2008) 012236.*

*Primary Examiner* — Paul Wartalowicz

(74) *Attorney, Agent, or Firm* — Paul Vincent

(57) ABSTRACT

A method for operating a superconducting device (1; 1*a*, 1*b*), having a coated conductor (2) with a substrate (3) and a quenchable superconducting film (4), wherein the coated conductor (2) has a width W and a length L, is characterized in that $0.5 \leq L/W \leq 10$, in particular $0.5 \leq L/W \leq 8$, and that the coated conductor (2) has an engineering resistivity $\rho_{eng}$ shunting the superconducting film (4) in a quenched state, with $\rho_{eng} > 2.5\ \Omega$, wherein $R_{IntShunt} = \rho_{eng} * L/W$, with $R_{IntShunt}$: internal shunt resistance of the coated conductor (2). The risk of a burnout of a superconducting device in case of a quench in its superconducting film is thereby further reduced to such an extent that the device can be operated without use of an additional external shunt.

13 Claims, 7 Drawing Sheets

(56) References Cited

U.S. PATENT DOCUMENTS

| | | | | |
|---|---|---|---|---|
| 2010/0296208 | A1* | 11/2010 | Tekletsadik | H01F 6/00<br>361/43 |
| 2010/0323899 | A1* | 12/2010 | Giunchi | 505/166 |
| 2011/0237440 | A1* | 9/2011 | Goto et al. | 505/123 |
| 2012/0002336 | A1* | 1/2012 | Usoskin et al. | 361/93.9 |

* cited by examiner

METHOD FOR OPERATING A SUPERCONDUCTIVE DEVICE WITHOUT AN EXTERNAL SHUNT SYSTEM, IN PARTICULAR WITH A RING SHAPE

This application is a continuation of Ser. No. 13/904,080 filed May 29, 2013 and also claims Paris convention priority from EP 12 171 087.5 filed Jun. 6, 2012 the entire disclosures of which are hereby incorporated by reference

BACKGROUND OF THE INVENTION

The invention relates to a method for operating a superconducting device, comprising a coated conductor with a substrate and a quenchable superconducting film, wherein the coated conductor has a width W and a length L.

Such a superconducting device is known for example from EP 2 192 629 A1.

Superconducting devices are used in different ways, in particular to transport electric currents, for current conditioning such as in fault current limiters, or for generating high strength magnetic fields.

Superconducting devices comprise a conductor which may, at a temperature below the so called critical temperature Tc, carry an electric current at practically no ohmic losses. In order to achieve said low temperature, the conductor is typically cooled with liquefied gases such as liquid helium. Further, to have a superconducting state, it is also necessary to stay below a critical current density and below a critical magnetic field with the conductor.

When using high temperature superconductor (HTS) materials, e.g. yttrium barium copper oxide (YBCO) material, higher temperatures, current densities and magnetic fields become accessible. HTS material is typically used as a film (or coating) on a normally-conducting or insulating substrate.

A difficulty when employing superconducting devices is the risk of a sudden loss of the superconducting state, also called a quench. If a region of a superconducting film quenches, a high electric current has to pass through the region now normally conducting, what causes a considerable heating of said region. The high current and heating may damage the superconducting material, what is also called a burnout.

Generally, it is desired that a superconducting device can survive a quench, so it can be used again e.g. after recooling of the device. In order to avoid a burnout of the superconducting material, it is known to protect superconducting films with shunt resistance.

EP 2 117 056 B1 discloses an elongated coated conductor, comprising a superconducting film on a substrate, covered by a first metallic member, and electrically connected to a resistive member running in parallel to the elongated conductor via regularly spaced bridge contacts. The resistive member is spaced apart from the elongated conductor, so the resistive member is thermally decoupled from the elongated coated conductor. The resistive member provides an external shunt protection.

In case of a quench in the superconducting film, the major part of the electric current is rerouted around the quenched region through the resistive member, so the current strength through the elongated conductor in the quenched region is reduced. The major heating occurs in the resistive member then, and not in the elongated conductor.

It is also known to cover or encapsulate superconducting films with a normally conducting stabilization layer, e.g. made of copper, compare U.S. Pat. No. 7,774,035 B2.Again, in case of a quench, the electric current is to be rerouted through the stabilization layer in order to preserve the superconducting films. The stabilization layer provides an internal shunt system for a coated conductor.

Coated conductors with external shunt protection are difficult to manufacture. Internal shunt protection may reroute a major part of the electric current away from the superconducting film, but heating may still damage the superconducting film. Therefore, even when using known external and internal shunt protection, a burnout of the superconductor film may still occur.

It is the object of the invention to further reduce the risk of a burnout of a superconducting device in case of a quench in its superconducting film.

SUMMARY OF THE INVENTION

This object is achieved, in accordance with the invention, with a method for operating a superconducting device having a coated conductor, the coated conductor of the superconducting device comprising a substrate and a quenchable superconducting film, wherein said coated conductor has a width W and a length L, with $0.5 \leq L/W \leq 10$ ,the coated conductor having an engineering resistivity $\rho_{eng}$ shunting said superconducting film in a quenched state thereof, wherein $\rho_{eng} > 2.5\Omega$, with $R_{IntShunt} = \rho_{eng} * L/W$ and $R_{IntShunt}$: an internal shunt resistance of the coated conductor, wherein the substrate is a metallic substrate electrically insulated from said superconducting film, a thin metallic substrate or a thin metallic substrate having a thickness $T \leq 100$ µm. In accordance with the inventive method, the superconducting device is operated without use of an additional external shunt.

The inventors have found that surprisingly, when the length L of the coated conductor (or its superconducting film, respectively) is chosen sufficiently small as compared to the width W of the coated conductor (or its superconducting film, respectively), namely up to about ten times the width W, and the engineering resistivity $\rho_{eng}$ is chosen sufficiently large, namely above 2.5 Ohms, the risk of a burnout of the superconducting film in case of its quench becomes very low. Accordingly, a superconducting device meeting the above criteria is very likely to survive a quench event, so expensive replacements after a quench may be avoided. An external shunt protection (which is thermally decoupled from the coated conductor or its superconducting film, respectively, such as bridge contacts linking a spaced apart resistive member) is not necessary and typically dispensed with, in accordance with the invention.

In use, the superconducting film carries a current in the direction of the extension of the length L of the coated conductor. The internal shunt resistance is the (ohmic) resistance of the coated conductor in the quenched state, available to the electric current that would flow through the superconducting film in the superconducting state, excluding any external shunt protection. The current paths providing the internal shunt resistance are thermally coupled to the coated conductor or its superconducting film, respectively (such as the substrate or cap layers on the superconducting film).

Note that the thickness of the superconducting film (on top of the substrate, perpendicular to the substrate plane) and the height of the coated conductor (perpendicular to the substrate plane) seem to be irrelevant for the inventive protective effect against burnout, at least as long as said height is in a reasonable range, such as below 400 µm.

The engineering (internal shunt) resistivity $\rho_{eng}$ according to the invention is comparably high, typically available only with a dielectric (electrically insulating) substrate, or with a metallic substrate electrically insulated from the superconducting film, or with a rather thin metallic substrate. In particular, the engineering (internal shunt) resistivity $\rho_{eng}$, in accordance with the invention is higher than with a non-insulated metal substrate of typical thickness (which is about 100 μm).

A particularly reliable protection against burnout of the superconducting film can be achieved when choosing $\rho_{eng}>5.0\Omega$.

In the inventive method for operating a superconducting device, the substrate is

- a metallic substrate electrically insulated from the superconducting film,
- a dielectric substrate, or
- a thin metallic substrate, in particular with a thickness $T\leq 100$ μm.

When choosing a substrate according to one of the above types, the engineering resistivity can easily be set in accordance with the invention.

Further preferred is an embodiment wherein W≥12 mm, in particular W≥40 mm. Moreover, it is preferred when W≥50 mm, in particular W≥100 mm. These dimensions have shown good results in practice. A large width W allows a comparably large length L.

Also preferred is an embodiment wherein L≥10 cm, in particular L≥36 cm. Moreover, it is preferred when L≥50 cm, in particular L≥100 cm. With such large lengths, closed loops with a comparably large cross-sectional area can be formed.

In another preferred embodiment, the superconducting film comprises YBCO material. YBCO films have shown a high immunity against damage upon quench (burnout) in an inventive superconducting device.

Also within the scope of the present invention is a method for operating a superconducting device, comprising a coated conductor with a substrate and a quenchable superconducting film, wherein the coated conductor has a width W and a length L, characterized in that the length of a primary normal zone generated by a quench in the quenchable superconducting film corresponds to the length L of the coated conductor or to a substantial part of the length L of the coated conductor. This reduces the risk of a burnout of a superconducting device in case of a quench in its superconducting film. A "primary normal zone" is a first minimal-area zone which crosses the width W of the quenchable superconducting film at the first stage of quench.

This zone exhibits a normal (in particular metallic) conductivity which forms as a result of a full or a partial (local) quench of the quenchable superconducting film. The formation of the primary normal zone is very short in time: for tape widths of 40-100 mm this process takes 10-40 microseconds. Further development of the normal zone leads to its propagation along the length of the quenchable superconducting film. Within the first 100-200 microseconds the normal zone may spread across a distance that corresponds to from 2 to 20 widths W (if the coated conductor is long enough). A substantial part of the length L of the coated conductor is, in particular, 25% or more of the length L, preferably 50% or more of the length L.

In an advantageous embodiment of an above mentioned method for operating a superconducting device, the coated conductor forms a closed loop. Accordingly, a circular superconducting current may run through the superconducting film with a minimum of jointing; such a closed loop may in particular be used in an AC fault current limiter. The width W becomes a height of a basically ring-shaped structure here. Note that the in accordance with this embodiment, a superconducting bridge element may be employed to electrically close the loop between the two ends parts of the superconducting film (corresponding to two joints); note that the bridge element typically bridges a gap GP much shorter than the length L here, typically with L≥10*GP, preferably L≥30*GP. Alternatively, it may be preferred to do without a bridge element and realize the closed loop structure with direct jointing of the superconducting film parts at the end regions of the coated conductor (i.e. with only one joint), or even without joints at all (see below).

In an advantageous further development of this embodiment, in an end region of the coated conductor, a part of the substrate is removed, and superconducting film parts at said end region and at a further end region of the coated conductor are jointed with each other, in particular wherein a mechanical support structure is provided on top of the superconducting film at the end region near the removed part. The part of the substrate may be removed by etching, for example.

In another advantageous further development, the substrate of the coated conductor is of a ring type, in particular circular ring type. Here a closed loop substrate (typically of metal type) is prepared first (e.g. by cutting away a piece of a seamless metal tube) and then the superconducting film is deposited, typically on the outer side of the cut substrate ring. Jointing is completely unnecessary in this further development.

Yet another further development provides that two end regions of the coated conductor are bent inward or outward, and the superconductor film parts at said end regions are jointed with each other. This jointing is particularly simple. The end regions typically show a v-shaped jointing region here.

Also within the scope of the present invention is a method for operating a superconducting assembly, comprising a plurality of coaxially arranged superconducting devices of closed loop structure, placed one within the other. Thus a particularly high current carrying capacity for circular currents can be achieved in a compact design.

Further within the scope of the present invention is a method for operating a fault current limiter, using the inventive method for operating a superconducting device or superconducting assembly. In a fault current limiter, a high tolerance against burnout is particularly valued. The fault current limiter may be of resistive (DC) or inductive (AC) type.

In a preferred embodiment of the inventive method for operating a fault current limiter, the fault current limiter is of AC type with a primary coil for carrying a current to be limited and a secondary coil to be coupled to the primary coil via a common magnetic flux, and the superconducting device or superconducting assembly is included in the secondary coil. Within the secondary coil, superconducting devices in a closed loop arrangement are particularly useful.

A further development of this embodiment provides that the secondary coil comprises a plurality of sub-coils which are realized as superconducting devices with a closed loop structure, wherein said superconducting devices are placed next to each other and within the primary coil. These sub-coils can be built with a high aspect ratio, what makes it easier to adhere to the inventive geometry.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

The invention is shown in the drawing.

DESCRIPTION OF THE PREFERRED EMBODIMENT

Figure 1:
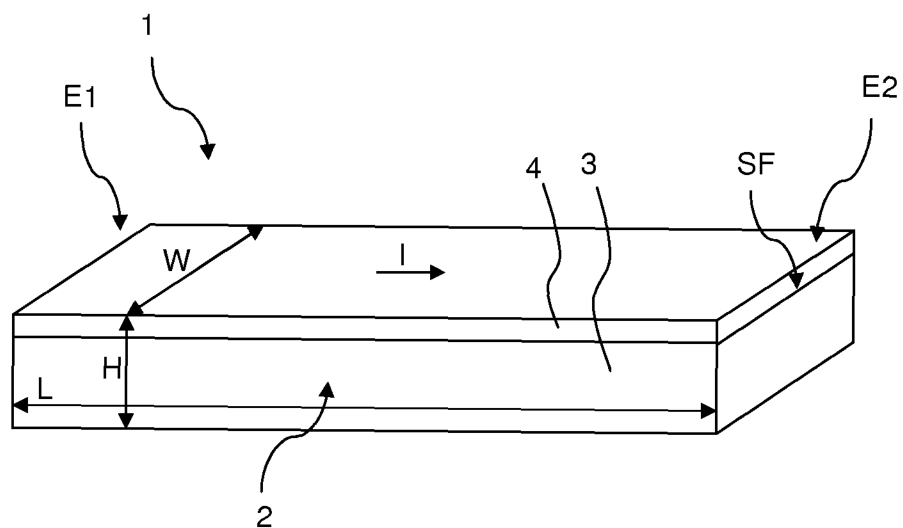
FIG. 1 an embodiment of the superconducting device, suitable for operation in accordance with the inventive method, with a flat coated conductor, in a schematic perspective view.

FIG. 1 shows an embodiment of a superconducting device 1 suitable for operation in accordance with the present invention. In FIG. 1, the general geometry is particularly obvious.

The superconducting device 1 here consists a coated conductor 2, with a substrate 3 and a superconducting film 4 deposited on top of it. Note that there may be additional layers, such as one or more buffer layers between the substrate 3 and the superconducting film 4, and protection and/or shunting layers (capping layers) on top of the superconducting film 4 (not shown for simplification).

The coated conductor 2 has a length L, in the direction of which flows, in use, a superconducting current I (or normally conducting current, in case of a quench). The coated conductor 2 has a width W and a height H. Typical lengths L are about 10 cm and above. Typical widths are at about 12 mm and above. The height H is typically 400 μm or less.

In the example shown, the ratio of L/W is about 4. In accordance with the inventive method, said ratio is between 0.5 and 10, preferably between 0.5 and 8.

The coated conductor 2 has, between its ends E1 and E2 in the non-superconducting state, an internal shunt resistance $R_{IntShunt}$ of about 12 Ohms here; said resistance can be measured, e.g., by contacting the opposing side faces SF (only one of which is visible in FIG. 1) of the superconducting film 4 with metallic electrodes and measuring the voltage at a known electric current. An engineering resistivity $\rho_{eng}$ with $\rho_{eng}=R_{IntShunt}*W/L$ results here to 3.0 Ohms then. In accordance with the inventive method, $\rho_{eng}$ is above 2.5 Ohms, preferably above 5 Ohms.

A superconducting device 1 suitable for operation in accordance with the inventive method shows a very low probability of a damage upon a quench of the superconducting film 4.

The inventive engineering resistivity $\rho_{eng}$ is significantly higher than typical engineering resistivities known form conventional coated conductors, e.g. of YBCO type.

Figure 2A:
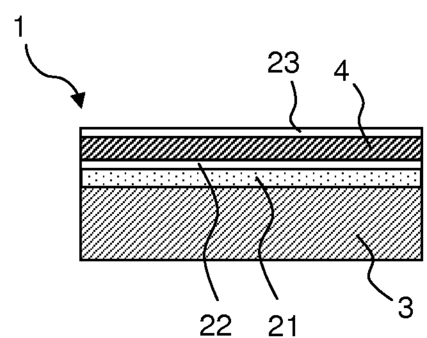
FIG. 2*a* an embodiment of the superconductive device , suitable for operation in accordance with the inventive method, in schematic cross-section, with a metallic substrate and a dielectric intermediate layer.

The large engineering resistivity, in accordance with the inventive method, may be achieved for example by providing a dielectric (electrically insulating) intermediate layer 21 between a metal substrate 3 and the superconducting film 4, compare FIG. 2*a* showing a superconducting device 1, suitable for operation in accordance with the inventive method, in cross-section. In addition, a buffer layer 22 between the substrate 3 and the superconducting film 4 may be used in order to increase the crystal quality of the superconducting film 4 (typically, the superconducting film is epitaxial). In the example shown, there is also a protection layer 23 of a precious metal (such as gold) on top of the superconducting film 4. If desired, a shunt layer (typically of copper) may further be deposited (not shown); however this shunt layer should be relatively thin in order to keep the internal shunt resisitivity large enough. It should be noted that the protection layer 23 as well as a possible shunt layer should not be enveloping and therefore not electrically connect the superconducting film 4 with the metallic substrate 3, in order to exclude the metal substrate 3 from affecting the internal shunt resistance.

Figure 2B:
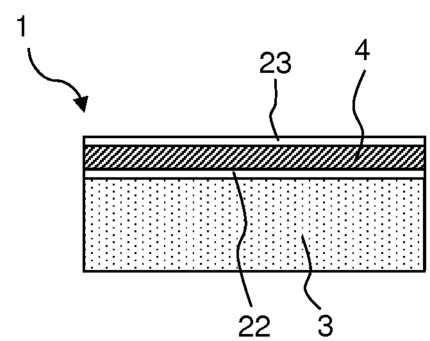
FIG. 2*b* an embodiment of a superconductive device, suitable for operation in accordance with the inventive method, in schematic cross-section, with a dielectric substrate.

Alternatively, the substrate 3 may be of dielectric type, compare FIG. 2*b*. In this case, no insulation of the superconducting film 4 and the substrate 3 is necessary. In the example shown, a buffer layer 22 and a protection layer 23 are also used. If desired, a sufficiently thin shunt layer may be employed (not shown).

Figure 2C:
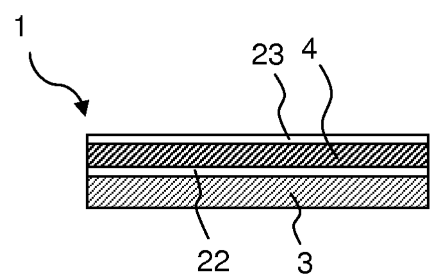
FIG. 2*c* an embodiment of a superconductive device, suitable for operation in accordance with the inventive method, in schematic cross-section, with a thin metallic substrate.

If the substrate 3 is sufficiently thin, compare FIG. 2*c*, the substrate 3, even if of metal type, need not be insulated from the superconducting film 4 in order to achieve a sufficiently large engineering resisitivity. In the example shown, there is again a buffer layer 22 and a protection layer 23. A sufficiently thin shunt layer may also be used, if desired (not shown).

Figure 3A:
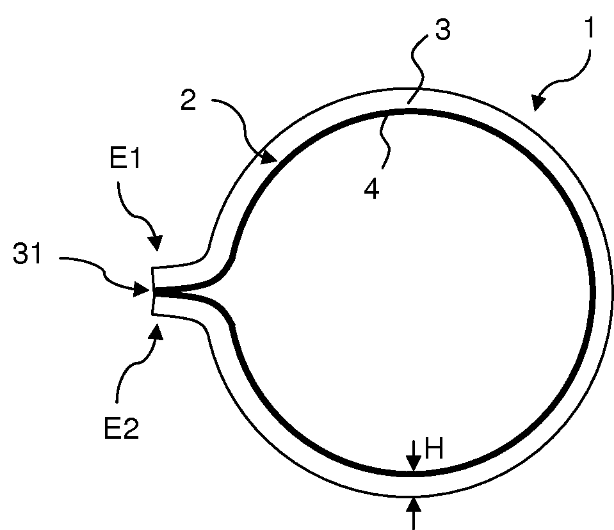
FIG. 3*a* an embodiment of a superconducting device, suitable for operation in accordance with the inventive method, with a closed loop structure, with outwardly bent ends of the coated conductor, in a schematic top view.
Figure 3B:
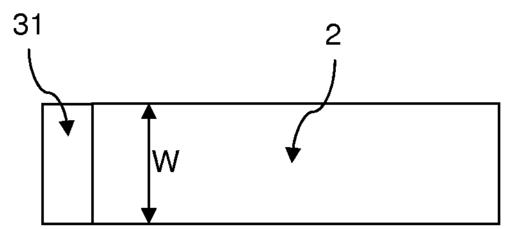
FIG. 3*b* the embodiment of FIG. 3*a* in a schematic side view.

FIG. 3*a* in a top view and FIG. 3*b* in a side view show a superconducting device 1, suitable for operation in accordance with the inventive method, wherein the coated conductor 2 forms a closed loop. The superconducting film 4

(shown as a thick black line, also in the following figures) is deposited on the inward side of the substrate 3. In order to establish a superconducting connection between the two ends of the superconducting film 4, the end regions E1, E2 of the coated conductor 2 are outwardly bent and the superconducting film 4 at the two end regions El, E2 is directly jointed together, typically using a silver solder, compare joint region 31. Note that alternatively, the end regions 31, 32 may be inwardly bent if the superconducting film 4 was deposited on the radially outer side of the substrate 3. This jointing is particularly simple.

Figure 4A:
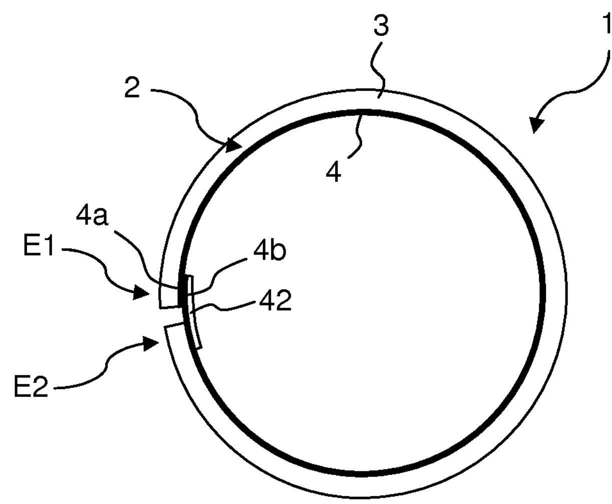
FIG. 4*a* an embodiment of a superconducting device, suitable for operation in accordance with the inventive method, with a closed loop structure, with substrate material removed at an end of the coated conductor, in a schematic top view.
Figure 4B:
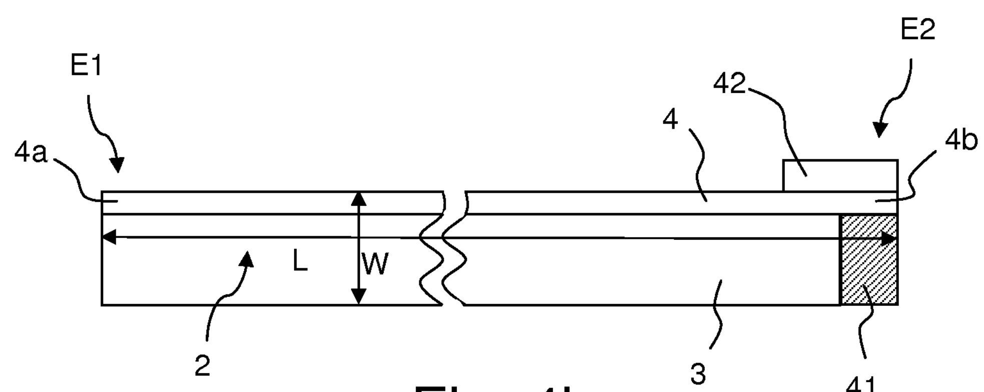
FIG. 4*b* the embodiment of FIG. 4*a*, in an uncoiled state, in a schematic illustration.

If bending the end regions of a coated conductor 2 is not possible (e.g. if the radius of curvature would be so small that the superconducting film 4 would be damaged), it is also possible to have a direct jointing of the superconducting film 4 at the end regions E1, E2 when removing (e.g. etching away) some part 41 of the substrate 3 at one end region, here E2, compare FIG. 4*a* in a top view and FIG. 4*b* in a decoiled view. In the area of the removed part 41, the coated conductor 2 of the other end region E1 may access with its superconducting film part 4*a* the remaining superconducting film part 4*b* of end region E2 directly (typically, a solder is used for this jointing, such as a silver solder). If needed, end region E2 may be mechanically stabilized by means of a stabilizing structure 42 (e.g. a thin metal film) so the remaining superconducting film part 4*b*, which is not supported by the substrate 3 any more, does not break off.

Figure 5:
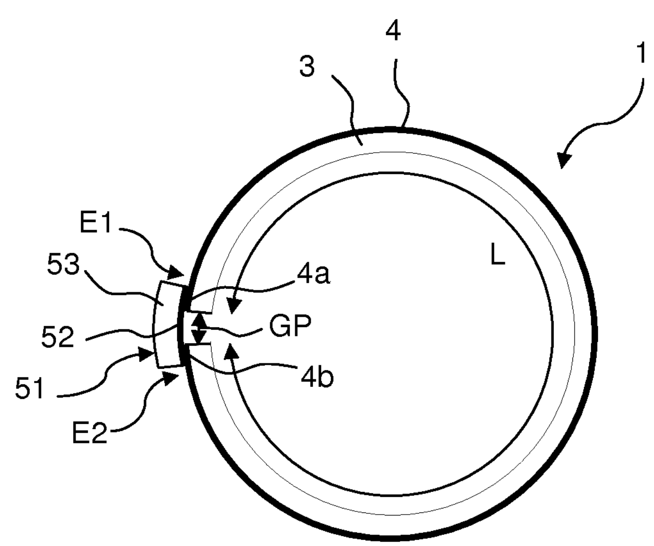
FIG. 5 an embodiment of a superconducting device, suitable for operation in accordance with the inventive method, with a closed loop structure, with a bridge element; in a schematic top view.

In another embodiment of a coated conductor 2 with a closed loop structure, shown in FIG. 5 in a top view, a bridge element 51 is used to provide a superconducting electric connection between the superconducting film parts 4*a*, 4*b* at end regions E1, E2. The bridge element 51 comprised a superconducting layer 52 on a bridge substrate 53, with the superconducting layer 52 being directly jointed (typically by means of a solder, such as a silver solder) to both superconducting film parts 4*a*, 4*b*. The bridge element 51 thus crosses a gap GP between the two end regions E1, E2 of the coated conductor 2, wherein said gap GP corresponds to about $1/20^{th}$ of the total length L of the coated conductor here. By use of a bridge element 51, bending of the coated conductor 2 is avoided.

Figure 6:
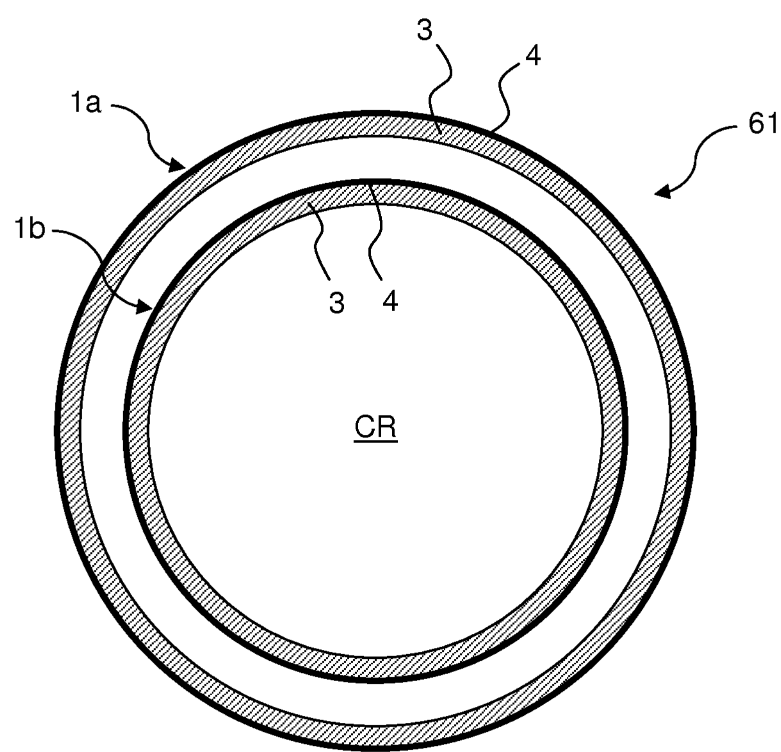
FIG. 6 an embodiment of a superconductive assembly, suitable for operation in accordance with the inventive method, comprising two superconducting devices with a closed loop structure, placed one within the other, in a schematic top view.

FIG. 6 shows in a top view a superconducting assembly 61, suitable for operation in accordance with the inventive method, comprising (here) two superconducting devices 1*a* ,1*b* ,which have both coated conductors in a closed loop structure, and with the superconducting devices 1*a* ,1*b* placed (here concentrically) one in another. In this arrangement, both superconducting devices 1*a*, 1*b* may affect the center region CR of the superconducting assembly 61, in particular by generating or interacting with a magnetic flux in the center region CR.

In the example shown, the two superconducting devices 1*a*, 1*b* are jointless, what may lead to particularly stable circular superconducting currents. In order to achieve this, closed ring shaped substrates 3 were produced first (for example by welding two ends of a tape type substrate, or by cutting a ring from a seamless tube produced by extrusion molding). Subsequently, the superconducting films 4 (and other layers, if need may be) were deposited on the substrates 3 (typically wherein a substrate ring is rotated under a deposition apparatus).

Figure 7A:
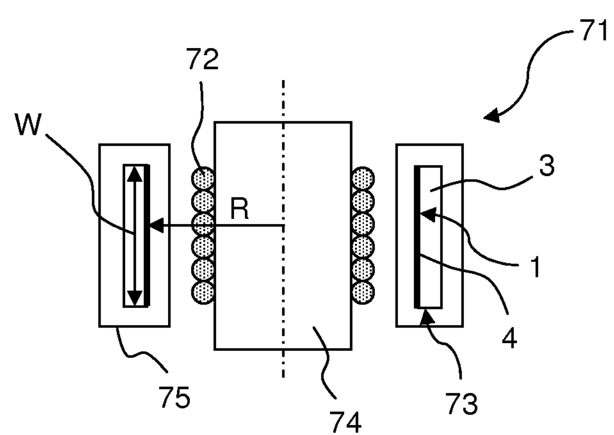
FIG. 7*a* an embodiment of a fault current limiter of AC type, suitable for operation in accordance with the inventive method, in a schematic cross-sectional view, with one secondary coil surrounding a primary coil.

FIG. 7*a* shows in a vertical, cross-sectional view a fault current limiter 71 of AC type, in which a superconducting device 1 (or alternatively superconducting assembly), suitable for operation in accordance with the inventive method, is used.

The fault current limiter 71 comprises a normally conducting primary coil 72 and a coaxially arranged secondary coil 73, which is realized with the superconducting device 1 as shown in FIG. 4*a* here; support structure of the secondary coil 73 is not shown, for simplification.

Inside the primary coil 72, a ferromagnetic core 74 is positioned, providing a good coupling of the primary and secondary coil 72, 73. During normal operation, the primary coil 72 carries an electric current to be limited against fault current, and in the secondary coil 73, a superconducting current is induced which largely counter-balances the magnetic field of the primary coil 72, so the primary coil 72 experiences no significant inductive resistance.

The secondary coil 73 is located within a cryostat 75, inside of which a cryogenic temperature (such as at or below 90K, preferably at or below 4.2K) has been established, so the superconducting device 1 or its superconducting film 4, respectively can assume the superconducting state.

In case of a rise of the current in the primary coil 72 ("fault current"), the current in the secondary coil 73 also rises, namely above the critical current Ic of the secondary coil 73, and the superconductivity collapses in the secondary coil 73 ("quench"). As a consequence, the primary coil 72 now experiences a considerable inductive resistance, what limits the current in the primary coil 72.

In order to be able to bear the quench, in accordance with the inventive method, the secondary coil 73 or the superconducting device 1, respectively, has a geometry with a ratio of length L (here corresponding to the circumference $2*R*\pi$ of the secondary coil 73) and width W of about L/W=6 ,and is realized with a dielectric substrate 3 carrying the superconducting film 4 so that the engineering resistivity $\rho_{eng}$ of the coated conductor is relatively high at about 3 Ohms.

Since the secondary coil 73 can stand a quench, the fault current limiter can easily be reused after a quench, in particular after having sufficiently recooled of the secondary coil 73.

Figure 7B:
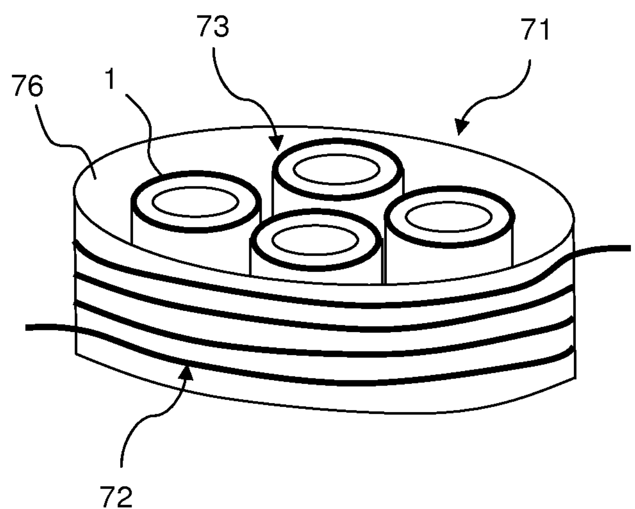
FIG. 7*b* an embodiment of a fault current limiter of AC type, suitable for operation in accordance with the inventive method, in a schematic perspective view, with several superconducting devices of closed loop structure arranged next to each other and placed within a primary coil.

FIG. 7*b* shows a further embodiment of a fault current limiter 71, suitable for operation in accordance with the inventive method, comprising a primary coil 72, here wound upon a cylinder shaped support 76, and a secondary coil 73 comprising a plurality of sub-coils, which are realized as inventive superconducting devices 1 with a coated conductor of closed loop structure ("one winding sub-coil"). Said superconducting devices 1 are arranged next to each other within the primary coil 72, so each sub-coil may interact with a part of the magnetic flux of the primary coil 72. For simplification, the cryostat for the superconducting devices 1 is not shown in FIG. 7*b*.

I claim:

1. A method for operating a fault current limiter, the fault current limiter comprising a superconducting device having a coated conductor, the coated conductor of the superconducting device comprising:

a substrate; and a quenchable superconducting film, wherein said coated conductor has a width W and a length L, with $0.5 \leq L/W \leq 8$, the coated conductor having an engineering resistivity $\rho_{eng}$ shunting said superconducting film in a quenched state thereof, wherein $\rho_{eng} > 5\ \Omega$, with $R_{IntShunt} = \rho_{eng} * L/W$ and $R_{IntShunt}$: an internal shunt resistance of the coated conductor, wherein the substrate is a metallic substrate electrically insulated from said superconducting film, a thin metallic substrate or a thin metallic substrate having a thickness $T \leq 100\ \mu m$, the method comprising the step of:

operating the fault current limiter and the superconducting device without use of an additional external shunt during a quench event and reusing the fault current limiter and the superconducting device subsequent to that quench event.

2. The method of claim 1, wherein the fault current limiter is an AC fault current limiter with a primary coil for carrying a current to be limited and a secondary coil to be coupled to said primary coil via a common magnetic flux, wherein the superconducting device is included in said secondary coil.

3. The method of claim 2, wherein said secondary coil comprises a plurality of sub-coils which are realized as superconducting devices, wherein said coated conductor forms a closed loop, the superconducting devices being placed next to each other and within said primary coil.

4. The method of claim 1, wherein W≥12 mm.

5. The method of claim 1, wherein W≥50 mm.

6. The method of claim 1, wherein L≥10 cm.

7. The method of claim 1, wherein L≥50 cm.

8. The method of claim 1, wherein said superconducting film comprises YBCO material.

9. A method for operating a fault current limiter, the fault current limiter comprising a superconducting device having a coated conductor, the coated conductor of the superconducting device comprising:

a substrate; and a quenchable superconducting film, wherein said coated conductor has a width W and a length L, with $0.5 \leq L/W \leq 8$, the coated conductor having an engineering resistivity $\rho_{eng}$ shunting said superconducting film in a quenched state thereof, wherein $\rho_{eng} > 5\ \Omega$, with $R_{IntShunt} = \rho_{eng} * L/W$ and $R_{IntShunt}$: an internal shunt resistance of the coated conductor, wherein the substrate is a metallic substrate electrically insulated from said superconducting film, a thin metallic substrate or a thin metallic substrate having a thickness T≤100 μm, wherein the coated conductor forms a closed loop, the method comprising the step of:

operating the fault current limiter and the superconducting device without use of an additional external shunt during a quench event and reusing the fault current limiter and the superconducting device subsequent to that quench event.

10. The method of claim 9, wherein, in an end region of the coated conductor, a part of said substrate is removed and superconducting film parts at said end region and at a further end region of the coated conductor are jointed with each other or a mechanical support structure is provided on top of said superconducting film at said end region near said removed part.

11. The method of claim 9, wherein said substrate of the coated conductor is a ring or a circular ring.

12. The method of claim 9, wherein two end regions of the coated conductor are bent inward or outward and superconductor film parts are jointed with each other at end regions thereof.

13. A method for operating a fault current limiter having a superconducting assembly, the superconducting assembly comprising a plurality of coaxially arranged superconducting devices, placed one within an other and operated according to the method of claim 9.

* * * * *